US006951824B2

(12) United States Patent
Fischer et al.

(10) Patent No.: US 6,951,824 B2
(45) Date of Patent: Oct. 4, 2005

(54) METHOD FOR MANUFACTURING A MICROMECHANICAL COMPONENT AND A COMPONENT THAT IS MANUFACTURED IN ACCORDANCE WITH THE METHOD

(75) Inventors: Frank Fischer, Gomaringen (DE); Peter Hein, Reutlingen (DE); Eckhard Graf, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/203,729

(22) PCT Filed: Dec. 28, 2000

(86) PCT No.: PCT/DE00/04673

§ 371 (c)(1),
(2), (4) Date: Nov. 8, 2002

(87) PCT Pub. No.: WO01/58803

PCT Pub. Date: Aug. 16, 2001

(65) Prior Publication Data

US 2003/0141561 A1 Jul. 31, 2003

(30) Foreign Application Priority Data

Feb. 10, 2000 (DE) .......................................... 100 06 035

(51) Int. Cl.[7] ............................................. H01L 21/302
(52) U.S. Cl. ....................................... 438/717; 438/737
(58) Field of Search ........................ 438/717, 737–739, 438/723

(56) References Cited

U.S. PATENT DOCUMENTS 5,627,318 A   5/1997  Fujii et al.
5,846,849 A   12/1998 Shaw et al.
6,067,858 A * 5/2000  Clark et al. ............... 73/504.16

FOREIGN PATENT DOCUMENTS

| DE | 195 37 814 | 4/1997 |
| EP | 0 138 023  | 4/1985 |
| EP | 0 451 992  | 10/1991 |
| EP | 0 890 978  | 1/1999 |

* cited by examiner

*Primary Examiner*—Hoai Pham
*Assistant Examiner*—Ginette Peralta
(74) *Attorney, Agent, or Firm*—Kenyon & Kenyon

(57) ABSTRACT

A method for manufacturing a micromechanical component, that has at least one hollow space and a functional element that is provided at least partially in the hollow space and/or a functional layer that is provided at least partially therein, and a micromechanical component that is manufactured in accordance with the method, are described. To reduce manufacturing costs, the functional element and/or the functional layer is provided with a first protective layer at least in an area that directly or indirectly borders on a first sacrificial layer, which temporarily occupies the space of the hollow space that is subsequently formed in one or a plurality of etching steps, the material of the first protective layer being selected such that at least one etching process and/or etching medium, which etches or dissolves the first sacrificial layer, either does not substantially attack the first protective layer or does so only at a reduced etching rate in comparison to the first sacrificial layer.

11 Claims, 6 Drawing Sheets

METHOD FOR MANUFACTURING A MICROMECHANICAL COMPONENT AND A COMPONENT THAT IS MANUFACTURED IN ACCORDANCE WITH THE METHOD

FIELD OF THE INVENTION

The present invention relates to a method for manufacturing a micromechanical component and to a micromechanical component that is manufactured in accordance with the method.

BACKGROUND INVENTION

German Published Patent Application No. 19537814A1 discusses the design of a sensor-layer system and a method for the hermetic encapsulation of sensors in surface micromechanics.

SUMMARY OF THE INVENTION

A method according to an exemplary embodiment of the present invention has the advantage that a hermetically sealed, closed-off component may be manufactured in a more cost-effective manner.

In contrast to conventional components, a component according to an exemplary embodiment of the present invention may result in a reduction in the surface required for the encapsulation, which may lead to cost reduction as a result of the reduction in the surface area. In a component according to an exemplary embodiment of the present invention, such as a sensor, the freedom of motion for movable structures called for in the component may be preserved, even if lateral amplitudes of more than approximately 2 $\mu$m may need to be achieved for the structures. This can be the case, for example, if the movable structure, i.e., the functional element, is a rotational oscillator. On the other hand, the maximum deflection of the movable structures, e.g., in a sensor, perpendicular to the latter can be limited to amplitudes between roughly 2 and 20 $\mu$m, which significantly increases, in particular, the falling sturdiness of a component according to an exemplary embodiment of the present invention, in contrast to the conventional components. The movable structure, e.g., a sensor structure, in the component according to an exemplary embodiment of the present invention is surrounded by a hollow space in a gas-and/or water-tight manner, so that a defined, lastingly stable damping of the motion of the movable structure, e.g., the sensor structure, can be brought about in the hollow space, for example, through the gas pressure of a gas enclosed in the hollow space. The encapsulation according to an exemplary embodiment of the present invention may have great mechanical stability, so that a component according to an exemplary embodiment of the present invention may be able to stand up without difficulty to a hydrostatic pressure such as occurs, for example, in the so-called mold pressure during the process of packing micromechanical components in a plastic housing. Finally, a component according to an exemplary embodiment of the present invention, e.g., a sensor according to an exemplary embodiment of the present invention, may have a low topography, as a result of which it becomes possible, for example, to use so-called flip-chip technology in assembling the component.

The method according to an exemplary embodiment of the present invention preferably does without the conventional use of oxide layers that have a thickness of more than roughly 2 $\mu$m. Rather, thick layers are used that are advantageously configured largely in polycrystalline silicon, thus significantly reducing the mechanical stresses arising from differing thermal coefficients of expansion. This leads to a significantly improved planarity in the substrate. The method according to an exemplary embodiment of the present invention makes possible the problem-free use of optical lithography steps, since topographies of more than 6 $\mu$m are preferably avoided. Finally, one or a plurality of isotropic etching processes is used for removing one or a plurality of sacrificial layers (filler material) in the micromechanical component, e.g., creating a hollow space which has a movable structure. Isotropic (silicon) etching processes of this type are, e.g., those in which the etching media $XeF_2$, $ClF_3$, $ClF_5$, or plasma-activated $NF_3$, $Ar/F_2$, or $SF_6$ are used. In contrast to the conventional methods, in this context, the removal is carried out without the risk of the structure-to-be-exposed adhering at the higher ablation rate of the filler material to be removed.

DETAILED DESCRIPTION

Figure 1:
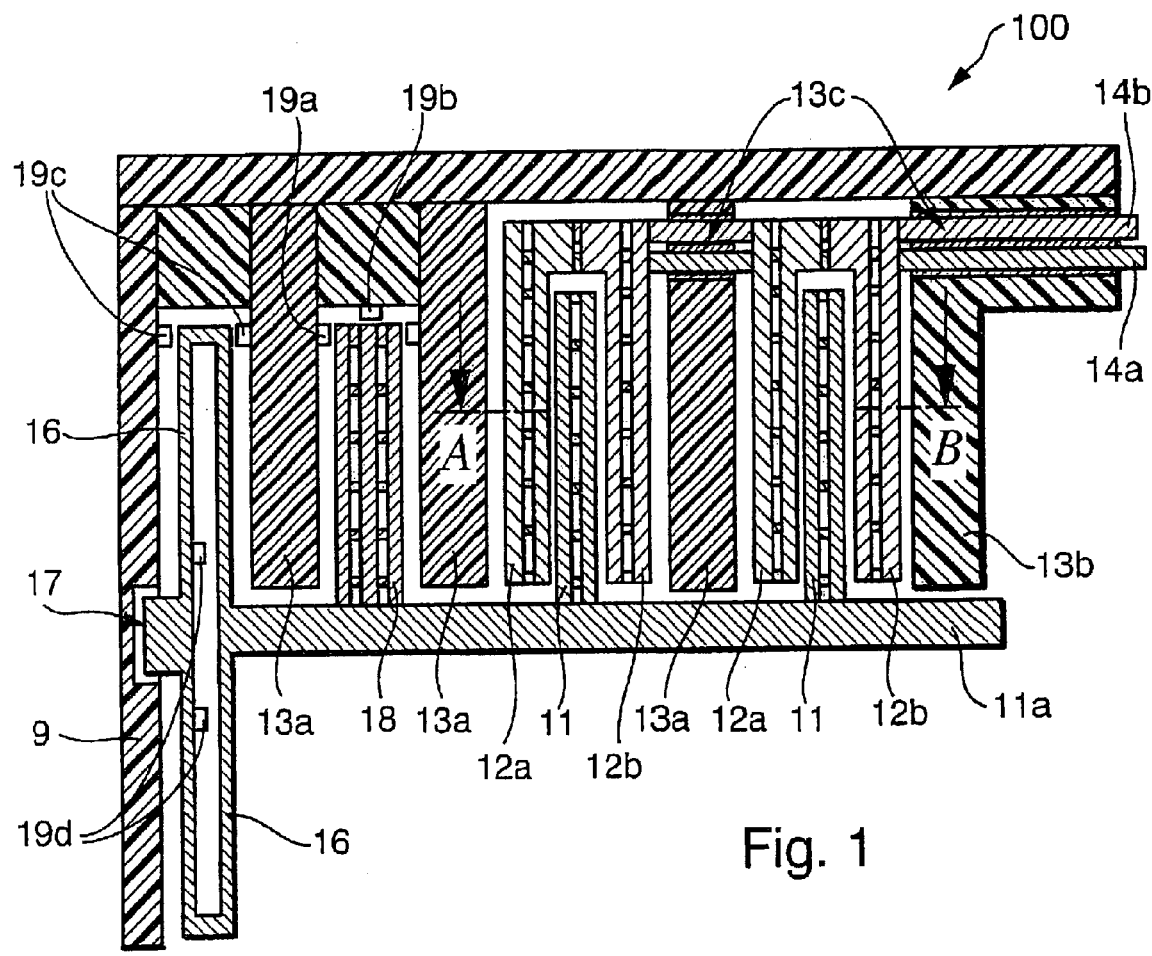
FIG. 1 depicts a cross-section of an acceleration sensor in the area of its functional element, which may be a sensor element.
Figure 2:
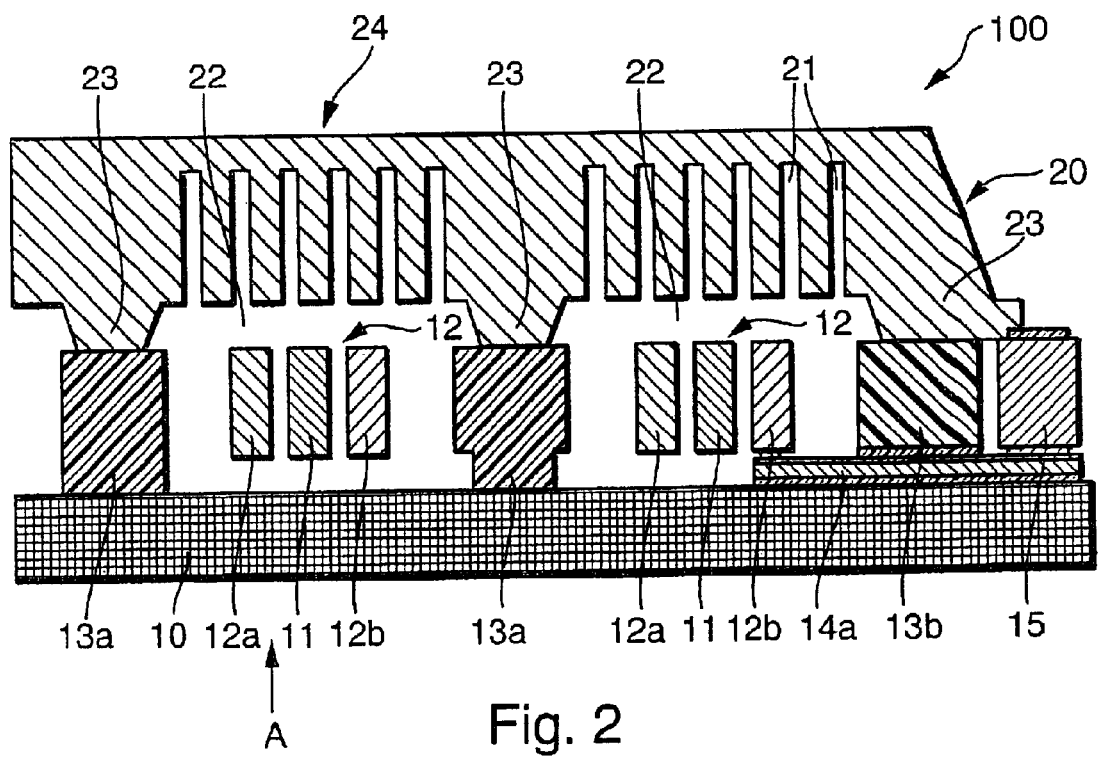
FIG. 2 depicts a cross-section of the area depicted in FIG. 1 along the sectional line A–B in FIG. 1, in which a contact terminal has also been included.

An exemplary embodiment of the present invention is discussed in greater detail below on the basis of the drawings, which are not drawn to scale. Identical reference numerals designate the same or equivalent layers or parts. On a substrate 10 that is depicted in FIG. 2, a sensor element 12 of an acceleration sensor 100 is structured. This sensor element is made up of a movable central mass, i.e., seismic mass 11a, arranged on spring body 16 (of which, for reasons of simplicity, in FIG. 1 only one single spring body 16 is depicted), the central mass having movable electrode fingers, or electrodes 11, that are provided in perpendicular fashion on the latter. Central mass, or seismic mass 11a, is linked to substrate 10 via spring bodies 16 and via anchoring structures 17 (of which, for reasons of simplicity, in FIG. 1 also only a single one is depicted), so that central mass 11a can be deflected by an acceleration acting upon it in a direction that is perpendicular to electrode fingers 11. As a result, the position of central mass 11a is changed with respect to the fixed electrode fingers, i.e., counter-electrodes 12a and 12b. This change in position is evaluated, in a conventional manner, via electrical terminals on counter-electrodes 12a and 12b as well as via printed circuit traces 14a and 14b leading to the outside. In each case, three electrodes 12a, 11, 12b are arranged in a so-called interdigital arrangement, this arrangement in each case forming a capacitor element, which is provided between two laterally adjoining separating or support structures 13a The deflection of movable electrode fingers 11 is limited by stop arms 18 (of which, for reasons of simplicity, in FIG. 1 only a single one is depicted) and by stop knobs 19a (for x-deflections) and 19b (for y-deflections). Stop knobs 19c and 19d may be advantageously provided in the area of spring bodies 16, preventing spring bodies 16 from adhering.

It is possible in accordance with an exemplary embodiment of the present invention to provide two or more capacitor elements between two adjoining support structures 13a. Further more, alternatively or additionally, support structures can be provided which penetrate through cutouts in central mass 11a and which are connected to substrate 10.

Support structure 13a may be made entirely of silicon, thus effectively avoiding an underetching of support structure 13a in response to the etching of the sacrificial layers, i.e., etching, or removing, a lower sacrificial layer 31 and an upper sacrificial layer 52 (see FIGS. 10 and 11), as described below on the basis of FIGS. 3 through 12. Printed circuit traces 14a and 14b run through support structures 13c in support structure 13a, sacrificial layers insulating the printed circuit traces from the support structures. A support structure 13b facing contact terminal 15 of acceleration sensor 100, for the external contacting of printed circuit traces 14a and 14b, i.e., counter-electrodes 12a and 12b, also has an electrically insulated passage for circuit traces 14a and 14b.

Using the process sequence described below in detail on the basis of FIGS. 3 through 12, a supporting cap layer, inter alia, is created over acceleration sensor 100, depicted in FIG. 1 in a partial cutaway view. Cap layer 20 is supported on support structures 13a via connectors 23 such that hollow spaces 22 extend over the capacitor elements. Hollow spaces 22 have a width, which may lie in a range between roughly 20 μm and 200 μm. Cap layer 20 is provided with a perforation 21, which for reasons of simplicity is only designated using two reference numerals 21, so as to be able to etch, i.e., remove, sacrificial layers 31 and 52 selectively with respect to the component structure, the sacrificial layers being used in the manufacturing process of acceleration sensor 100. After the etching of the sacrificial layers, perforation 21 of component, i.e., acceleration sensor 100, is hermetically sealed by a sealing layer 24. For acceleration sensors or gyrometers, a vacuum or a gas having a defined pressure can be enclosed in hollow space 22 for generating a defined damping of the movement of the functional element, such as movable electrode fingers 11. In addition, it is also possible to use an insulating fluid having a suitable viscosity, such as an oil-like fluid, in the case of other components, such as actuators.

Figure 3:
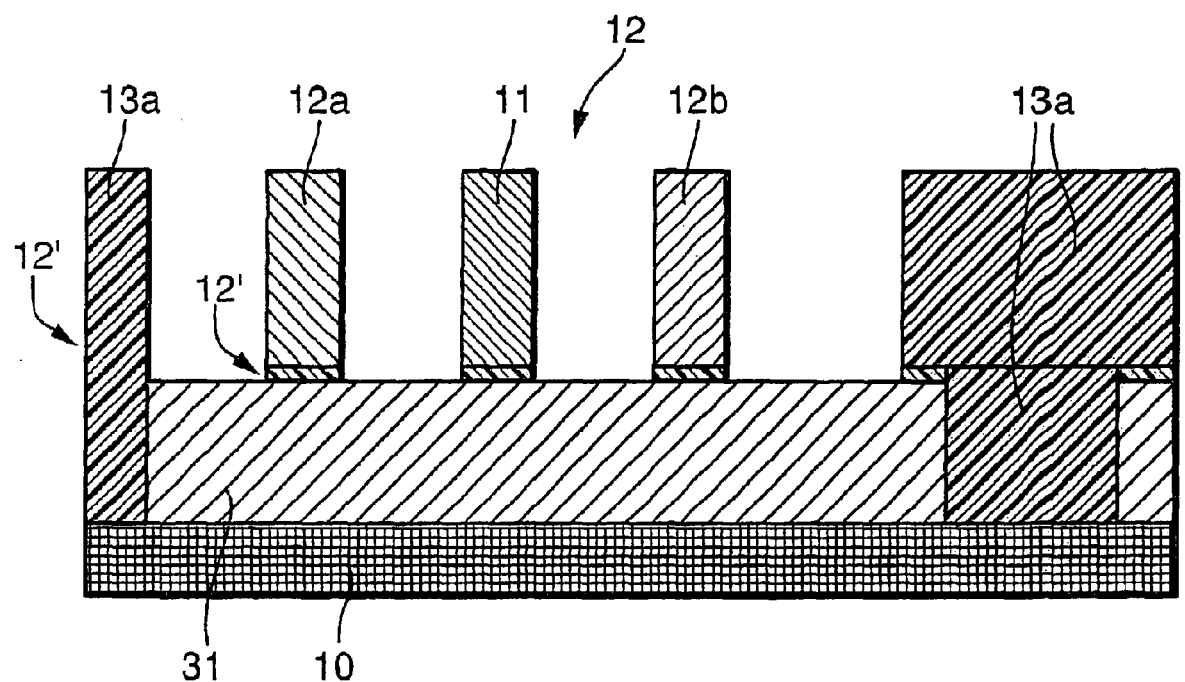
FIGS. 3–12 depict a method according to an exemplary embodiment of the present invention for manufacturing the acceleration sensor according to the present invention depicted in FIGS. 1 and 2.

FIG. 3 depicts the basic design of the sensor structure of acceleration sensor 100 by way of example for the part of the acceleration sensor depicted in FIG. 2 as A, as it is seen after a deep structuring and before the etching of the sacrificial layers. On substrate 10, a sacrificial layer 31 is deposited, which can be made up of, for example, one or plurality of $SiO_2$ layers. Deposited then on sacrificial layer 31 is the sensor element, i.e., functional element 12, which can be made of epipoly silicon, i.e., epitaxially produced polycrystalline silicon, which was deposited on a thin poly-Si nucleation layer 12' (start poly). In a Si-deep-structuring method (trench etching), sensor element 12 of acceleration sensor 100 is produced, such as, for example, fixed electrode fingers 12a and 12b and electrode fingers 11 arranged in perpendicular fashion on movable central mass 11a. Before the etching of the sacrificial layers, these functional elements are fixedly anchored on sacrificial layer 31. As a result of a pre-structuring of sacrificial layer 31, it is possible during the deposition and structuring of plane 12, to also produce fixing points on substrate 10, support structures 13a.

Figure 4:
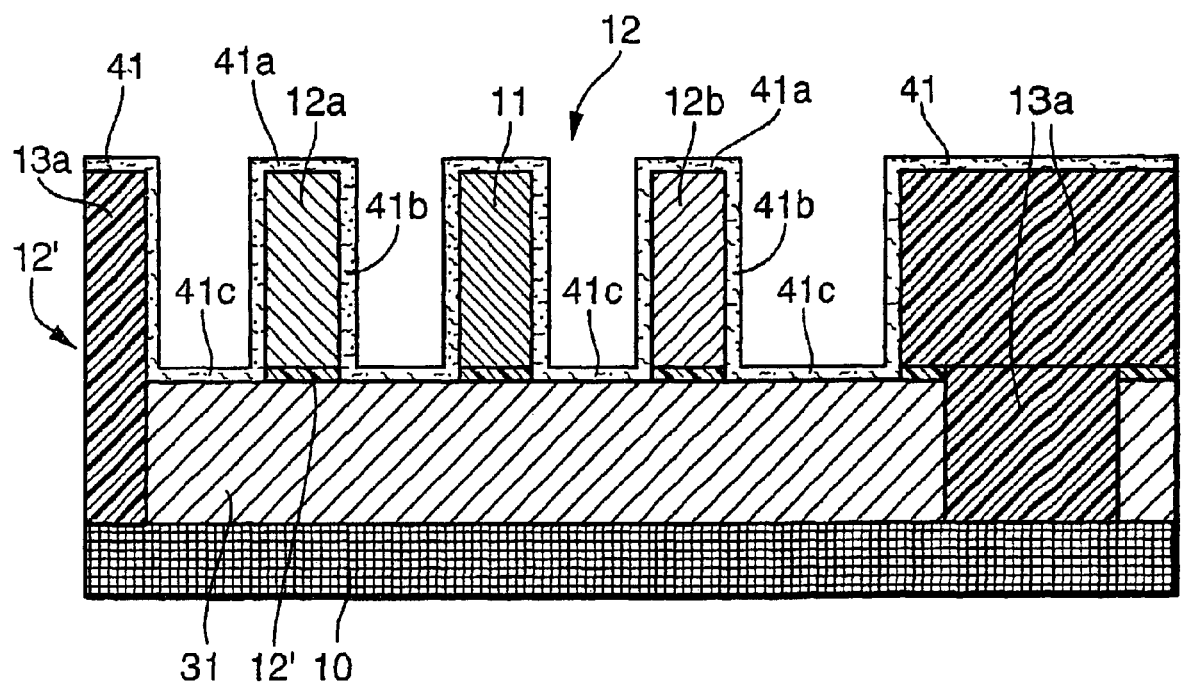

As is depicted in FIG. 4, a roughly 10 nm to 1 μm thin first protective layer 41 is deposited on entire sensor element 12 using a CVD process. The result, in areas 41a and 41b of first protective layer 41, is a complete covering of sensor element 12 on the so-called electromechanically functional level. In areas 41c of protective layer 41, lower sacrificial layer 31 is covered. According to an exemplary embodiment of the present invention, attention should be paid that protective layer 41, in a hermetically sealing manner, cover sensor element 12 on the electromechanically functional level, such as, in particular, movable electrode fingers 11 and counter-electrodes 12a and 12b, as well as other components of acceleration sensor 100, such as support structures 13a, which are not made of the same material as protective layer 41. Protective layer 41 is preferably made of $SiO_2$. Furthermore, lower sacrificial layer 31 can be made of, for example, $SiO_2$, as in this exemplary embodiment.

Sacrificial layer 31, in one alternative embodiment, can be enclosed in further protective layers, and it may then be preferably made of polycrystalline silicon.

Preferred deposition processes for generating protective layer 41 are CVD processes, such as PECVD (plasma-enhanced CVD) or LPCVD (low-pressure CVD), it being important to achieve the best possible coverage of the lateral surfaces of the components of sensor element 12 on the electromechanically functional level, areas 41b.

Figure 5:
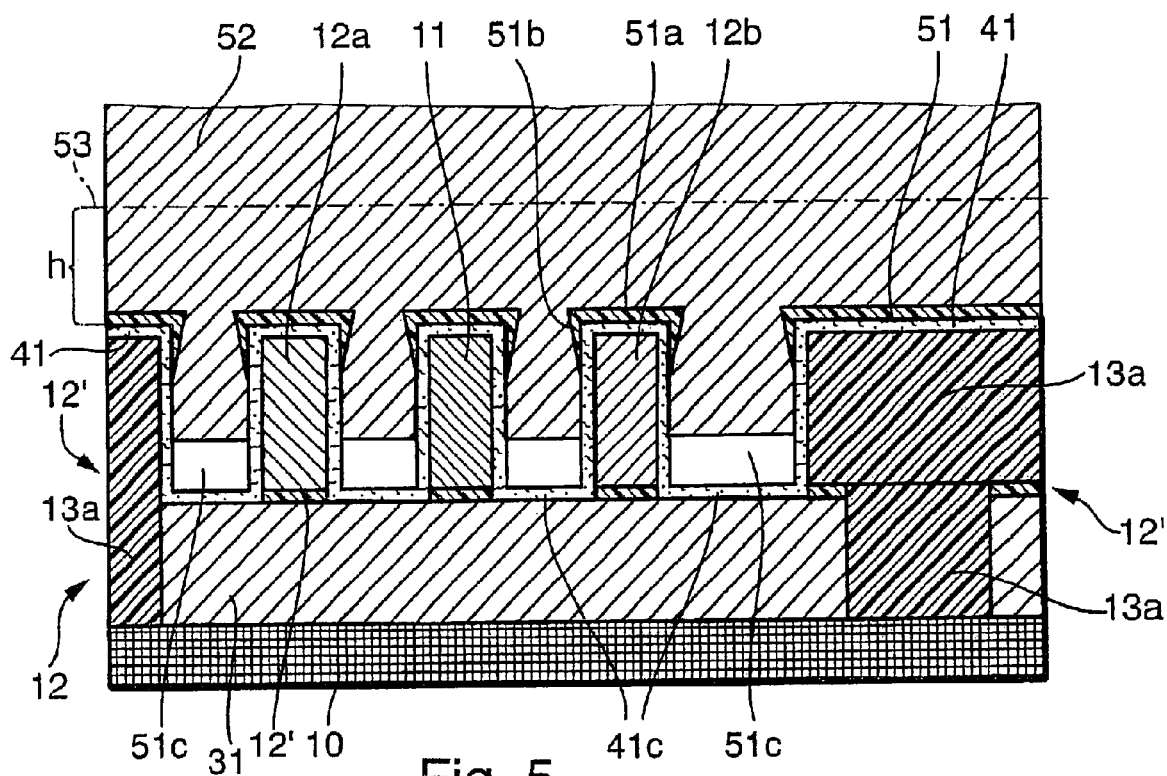

As depicted in FIG. 5, in a further process step, a thin start-poly-Si layer 51 mainly polycrystalline silicon layer having the function of a seed or nucleation layer, is deposited on protective layer 41. Due to the large aspect ratio, i.e., the ratio of the height to the width of gaps in area 51c of sensor element 12, it can happen that start-poly-Si layer 51 is mainly deposited in upper areas 51a on sensor element 12, and the deposition on lateral walls 51b of sensor element 12 only takes place in their upper area. Areas 51c at the foot of sensor element 12, above areas 41c of protective layer 41, are coated with start-poly-Si layer 51 only in the case of the larger gap widths between electrodes, i.e., support structures of sensor element 12. Deposited on start-poly-Si layer 51, using an epitaxy process, or LPCVD process, is a polycrystalline silicon layer, a so-called filler-epipoly-Si layer, sacrificial layer 52, start-poly-Si layer 51 merging into upper sacrificial layer 52. "Epi" signifies "epitaxial" and "poly" stands for "polycrystalline." Upper sacrificial layer 52 in the deposition may already be doped using phosphorus; nevertheless, it may preferably be deposited undoped. The layer thickness of upper sacrificial layer 52 is selected such that sensor element 12 is completely covered by it. This is typically the case in a layer thickness of roughly 5 to 30 μm.

A filler-epipoly-Si layer, i.e., sacrificial layer, having such a thickness usually has a pronounced roughness. In addition, the topography of sensor element 12 comes through in upper sacrificial layer 52. Therefore, the topography of sensor element 12 and the roughness of upper sacrificial layer 52 are planarized in a further process step. This takes place using a chemical-mechanical polishing process (CMP), in which upper sacrificial layer 52 is thinned down to a level 53. Level 53 lies above sensor element 12. Height h over sensor element 12 is roughly between 1 and 30 μm; the preferred height is roughly 4 to 6 μm.

Figure 6:
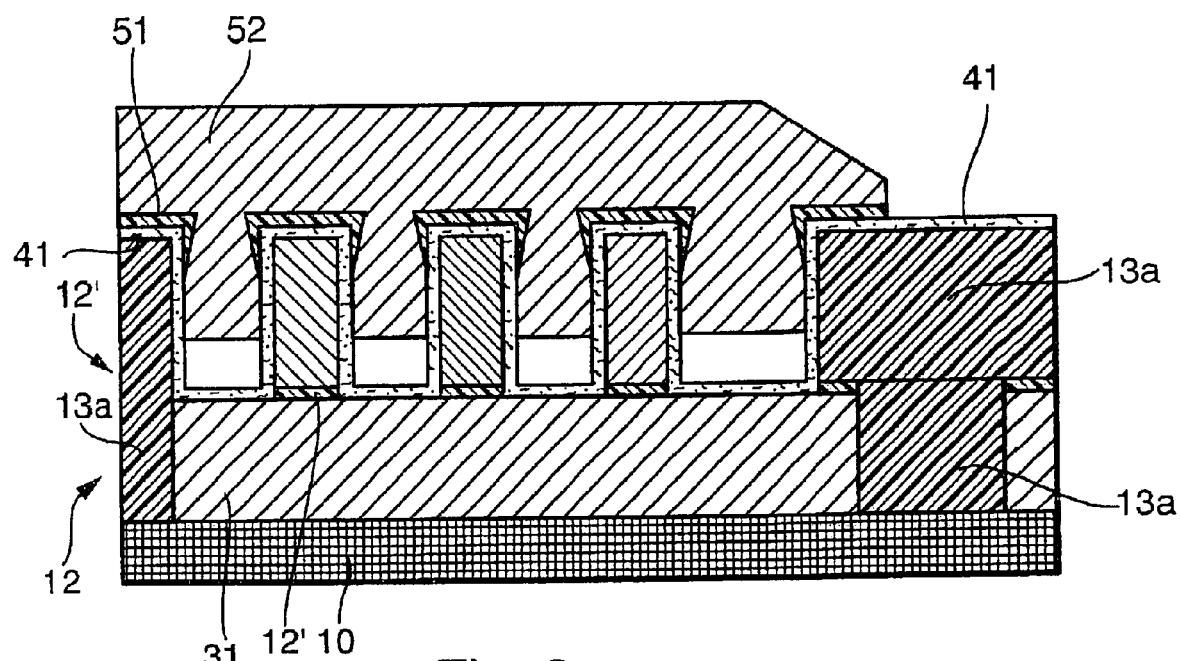

After the planarization, the structuring of upper sacrificial layer 52 is carried out using a conventional Si-etching process, as illustrated in FIG. 6. In this context, upper sacrificial layer 52 is left alone in areas, in which are arranged the movable sensor elements, such as spring bodies 16, movable electrode fingers 11, fixed electrode fingers, i.e., counter-electrodes 12a and 12b, and central mass, i.e., seismic mass 11a. Upper sacrificial layer 52 is removed over separating or support structures 13a down to silicon-oxide protective layer 41.

Figure 7:
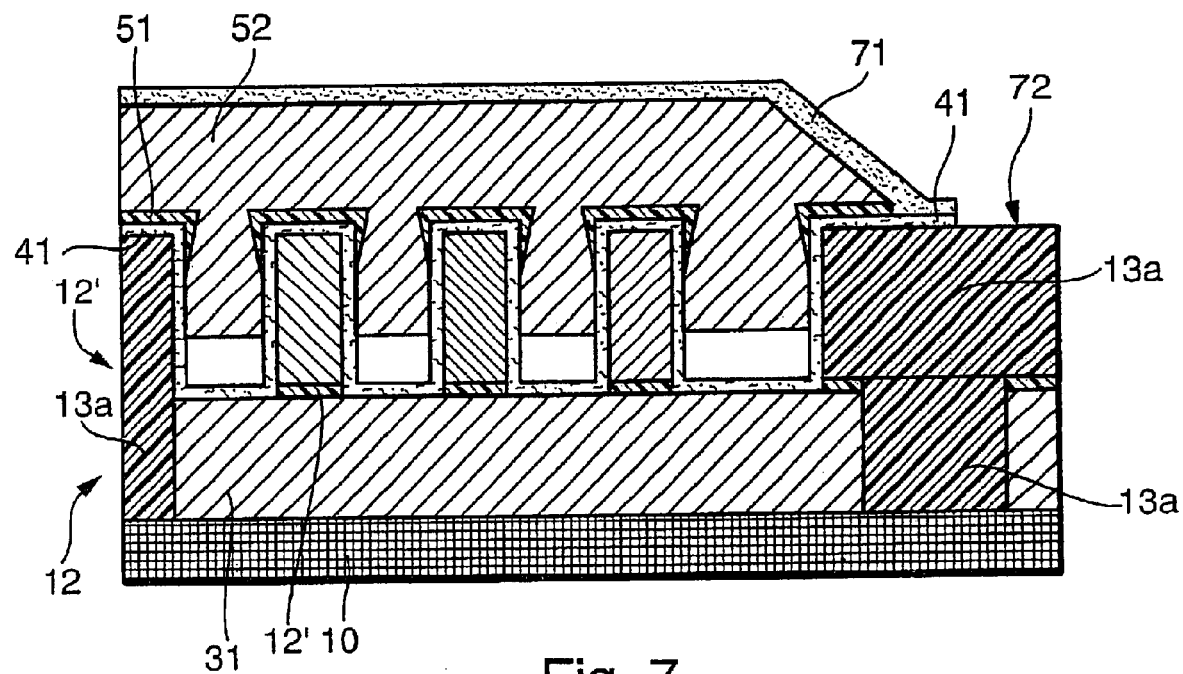

According to FIG. 7, a second protective layer 71 is applied to structured upper sacrificial layer 52. This protective layer 71 is preferably made of the same material as first protective layer 41, specifically SiO$_2$. Protective layer 71 is removed over support structures 13a in area 72 using a conventional process. According to an exemplary embodiment of the present invention, upper sacrificial layer 52 on entire acceleration sensor 100 is hermetically surrounded by protective layers 41 and 71, and that there is no connection between sensor element 12 and upper sacrificial layer 52. Sensor element 12 and upper sacrificial layer 52 may preferably be made of the same material. Furthermore, it may be preferable that protective layers 41 and 71, on the stationary areas, i.e., support structures 13a, merge into each other, or contact each other sealingly.

Figure 8:
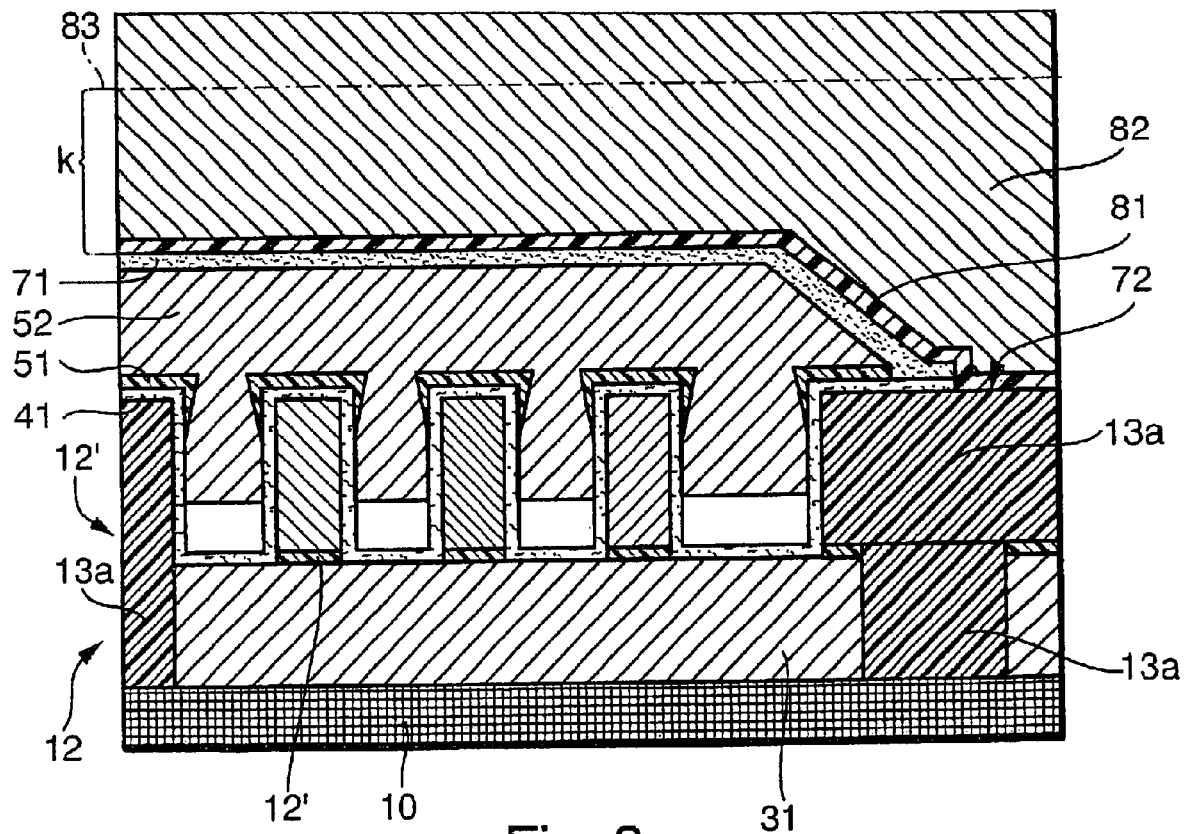

As depicted in FIG. 8, a further start-poly-Si layer, or nucleation, or germ layer 81, is applied over the entire surface on protective layer 71 and on exposed areas 72 at a layer thickness of between roughly 300 nm and 2 μm. Deposited on this start-poly-Si layer 81 is a further poly-silicon layer 82 using an epitaxial process or LPCVD process. The layer thickness may advantageously be between roughly 2 and 50 μm. Poly-silicon layer 82 is subsequently thinned and planarized down to a level 83. Residual thickness k between second protective layer 71 and level 83 may preferably be between roughly 2 and 50 μm. Poly-silicon layer 82 can be doped during the deposition or in a subsequent process step.

One aspect of an exemplary embodiment of the present invention is therefore to completely coat, in an advantageously thin protective layer, e.g., of silicon oxide, a structured poly-Si-functional layer, e.g., a movable sensor element or another functional element, for producing a hollow space that, in a micromechanical component, at least partially surrounds the functional layer, i.e., the functional element (see FIG. 4), and to deposit on this thin protective layer a further polycrystalline silicon layer, i.e., filler layer, an upper sacrificial layer (see FIG. 5). As a result of the polycrystalline silicon layer, the structured level, i.e., the functional layer of the component, is embedded and completely covered.

Another aspect of an exemplary embodiment of the present invention is to planarize the upper sacrificial layer and to close it off to the outside using a further, thin protective layer (see FIGS. 6 and 7). Deposited on this protective layer, closing off the upper protective layer to the outside, is a thick poly-silicon layer, which as a supporting layer forms a component or sensor cap (See FIG. 8).

According to an exemplary embodiment of the present invention, it is provided that the upper sacrificial layer is made of the same material as the functional layer. The sacrificial layer used in accordance with an exemplary embodiment of the present invention is enclosed by two sealed protective layers, so that the sacrificial layer can be selectively etched down to the protective layers, or can be removed through etching. The protective layers are then removed by etching the lower sacrificial layer. In this regard, it is advantageous that, as a result of the use, according to an exemplary embodiment of the present invention, of a filler layer, i.e., upper sacrificial layer, large gap widths in the functional layer, e.g., a layer that represents the sensors, can be filled in (see FIG. 5). As a result, it may be possible to achieve a high degree of freedom in the design of the component, or in the design of the sensor, especially with regard to the freedom of motion of the oscillator structures, or movable structures, in the component, or sensor.

As a result of a planarization step on the upper sacrificial layer (see FIG. 8), topographies are evened out, thus making possible a further structuring of the upper sacrificial layer using photolithography. A planarization of this type is only made possible by the use according to an exemplary embodiment of the present invention of silicon as a filler layer material, i.e., sacrificial layer. In the method according to an exemplary embodiment of the present invention, an isotropic silicon-etching step may preferably be employed, which may permit a removal of the upper sacrificial layer, i.e., filler layer, that is rapid and free of residue.

A further advantage of the method according to an exemplary embodiment of the present invention is that metal contacts for the external contacting of the functional layer, i.e., the sensor elements, and for the further transmission of the measuring signals emitted by the sensor elements for evaluation can only be applied at the end of the process.

The method according to an exemplary embodiment of the present invention can be used for producing a multiplicity of sensor and actuator components in surface micromechanics. It is also possible, on one single chip sensor or actuator, to integrate structures along with an evaluation circuit for evaluating the measuring signals emitted by these structures.

Figure 9:
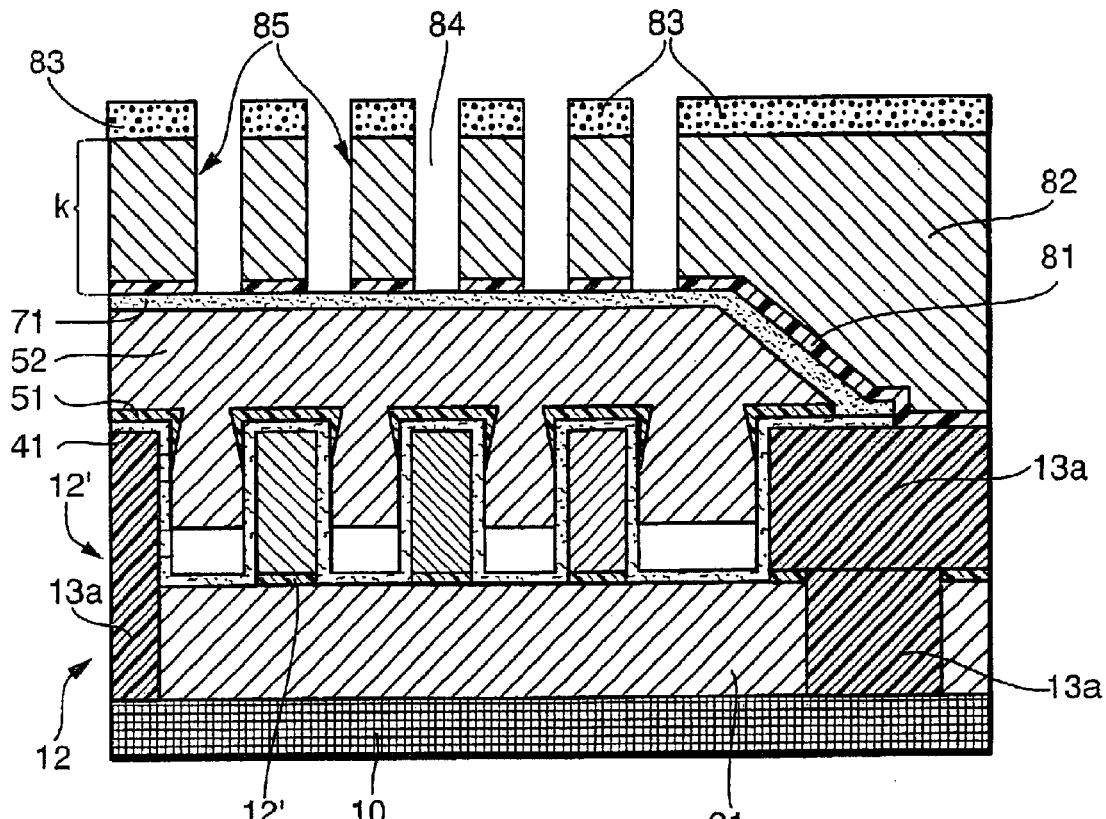

After the planarization and doping of poly-silicon layer 82, the latter is provided with a lacquer or oxide mask 83 and is structured using a conventional silicon deep-etching process (see FIG. 9). In this context, perforation holes 84 are created through poly-silicon layer 82 to upper sacrificial layer 52, the holes, in the deep structuring of sacrificial layer 82, ending only at second protective layer 71. The area of support structures 13a is left open in the perforation for the fixed binding of cap layer 20, i.e., sealing layer 24. In the deep structuring, a sufficiently thick lateral wall passivation 85 is deposited, it being preferably a fluoride-containing polymer compound. Lateral wall passivation 85 is a layer which assures that poly-silicon layer 82 is not attacked during a subsequent silicon etching step. In addition to polymers, for the lateral wall passivation, it is also possible, for the lateral wall protection, in addition to protective layers 41 and 71, to deposit a further thin protective layer, for example, of silicon oxide.

Figure 10:
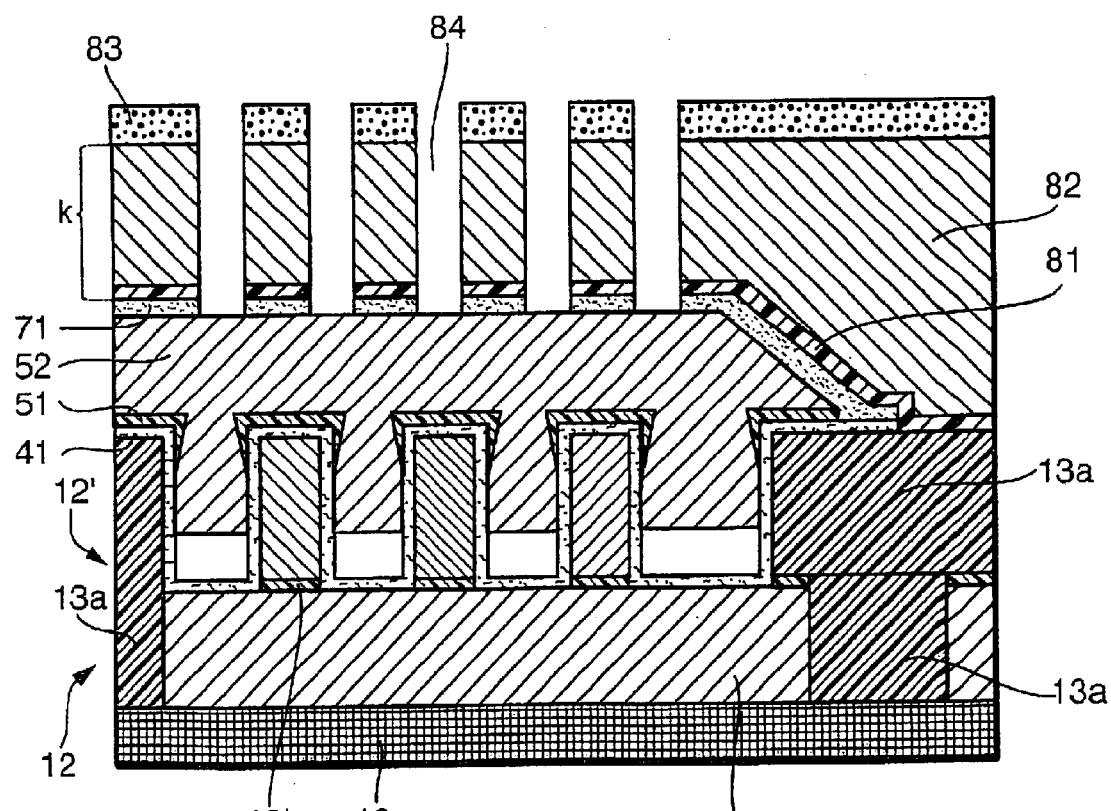

As indicated in FIG. 10, protective layer 71 in a subsequent step is removed in perforation holes, i.e., trenches 84, using a conventional etching process. As a result, direct access to upper sacrificial layer 52 is generated for its subsequent etching.

Figure 11:
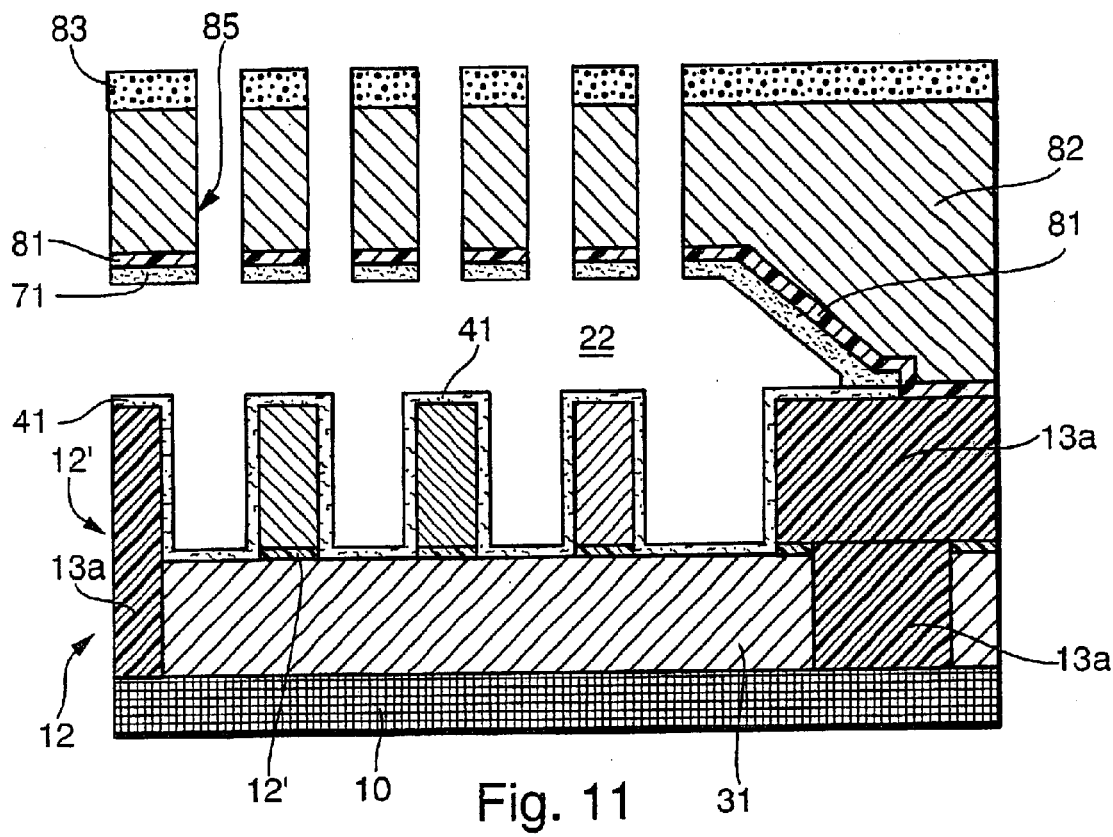
Figure 12:
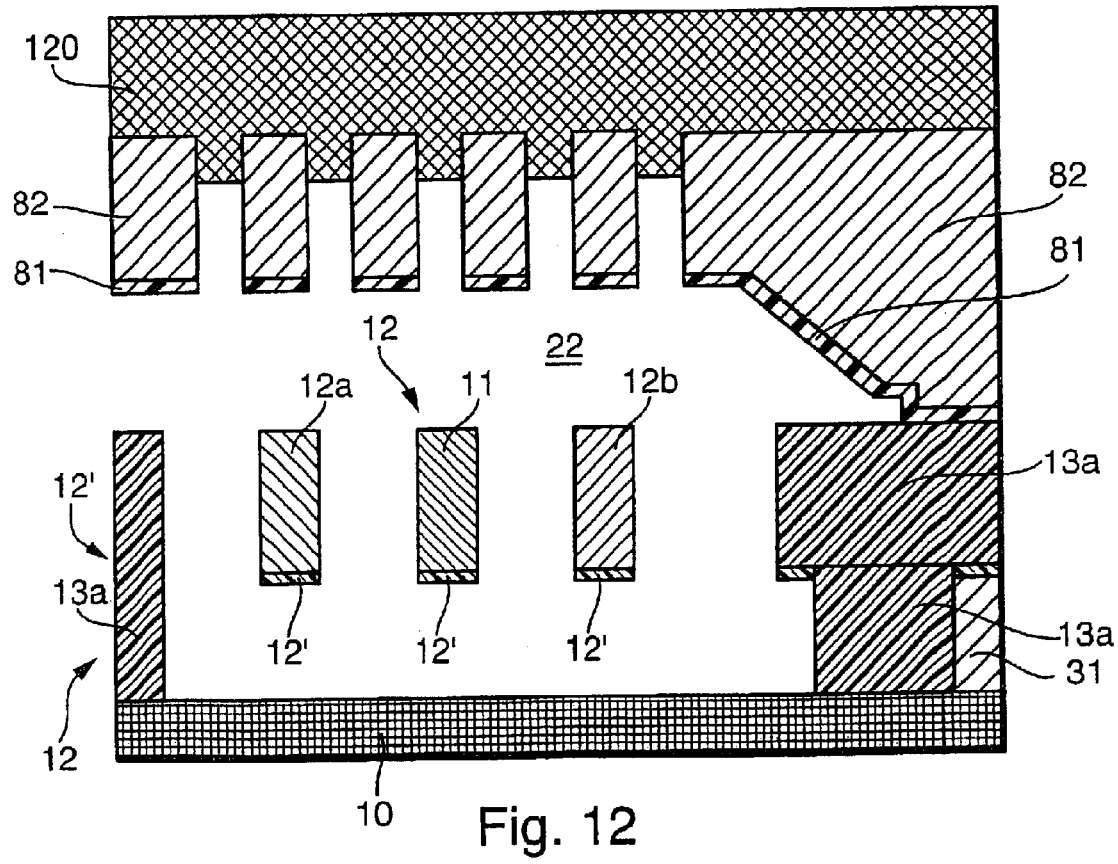

FIG. 11 depicts a central step for creating cap layer 20, in which upper sacrificial layer 52 has been selectively etched with respect to protective layers 41 and 71. For this purpose, isotropic etching processes may preferably be used, e.g., those in which are used etching media XeF$_2$, ClF$_3$, ClF$_5$, or plasma-activated NF$_3$, Ar/F$_2$, or SF$_6$. In the selective etching of upper sacrificial layer 52, with respect to protective layers 41 and 71, the etching of upper sacrificial layer 52 stops at the surfaces bordering on protective layers 41 and 71. An etching of the lateral walls of perforation holes 84, within poly-silicon layer 82 forming cap layer 20, is suppressed by lateral wall passivation 85 that is applied. At the end of the process, upper sacrificial layer 52 is entirely etched, or dissolved. A hollow space 22 is created over sensor element 12, which is covered over by a stable, supporting poly-silicon layer 82, or cap layer 20 (see, especially FIG. 2). In accordance with FIG. 12, after the etching of upper sacrificial layer 52, protective layers 41 and 71, which represent auxiliary layers, and lower sacrificial layer 31 are selectively etched with regard to sensor element 12 and poly-silicon layer 82, which forms cap layer 20 (see FIG. 2). For this purpose, a method based on the use of a vaporous HF/H$_2$O mixture can be used for etching SiO$_2$ layers. In this method, gaseous HF and H$_2$O penetrates through perforation holes 84 of cap layer 20 and arrives at protective layers 41 and 71, and after they are etched, at lower sacrificial layer 31. After this etching step, protective layers, i.e., oxide layers 41 and 71, and lower sacrificial layer 31 are removed, and all the movable structures of sensor element 12, such as central mass 11a, spring bodies 16, stop arms 18, and movable electrode fingers 11, are detached from substrate 10 (see especially FIGS. 1 and 2). Subsequent to this etching step, in a gaseous atmosphere, perforation holes 84 of polysilicon layer 82, i.e., of cap layer 20, are covered by a covering layer 120. Covering layer 120 may preferably be between roughly 1 and 20 μm thick and is made of, for example, an insulator, advantageously SiO$_2$, which may preferably have been deposited using a PECVD process. In the deposition of covering layer 120, a process gas may preferably be enclosed in hollow space 22 at the same time, thus making it possible to set the dynamic damping of the movable components of sensor element 12 of acceleration sensor 100 according to an exemplary embodiment of the present invention as a function of the pressure of the enclosed process gas and/or of its type. Enclosing a gas that dampens the motion of the movable components provided in acceleration sensor 100 according to an exemplary embodiment of the present invention can also take place in a further process step that is independent of the deposition process.

After the deposition of covering layer 120, metallic printed circuit traces 14a and 14b, as well as contact terminal 15, are manufactured in a conventional manner.

In one alternative embodiment of the present invention, it is provided that lower sacrificial layer 31 and upper sacrificial layer 52 are, in each case, made of polysilicon, whereas lower sacrificial layer 31 in the method depicted in FIGS. 3 through 12 is made of SiO$_2$. Deposited on substrate 10 in the alternative embodiment is a lower protective layer. Subsequent thereto is the deposition of the polysilicon sacrificial layer, on which subsequently an upper protective layer is deposited, so that lower sacrificial layer 31 is completely enclosed by the lower and the upper protective layer. The lower protective layer functions to protect against etching corrosion of substrate 10, and the upper protective layer protects sensor element 12, i.e., functional layers 13a, 13b, 13c, against etching corrosion in response to the selective etching, i.e., removal, of the lower sacrificial layer. The protective layers for both sacrificial layers are preferably made of silicon oxide, so that the two sacrificial layers of the same material can be removed in one single or a plurality of etching steps.

Due to the planarity of the component that can be manufactured using the method according to an exemplary embodiment of the present invention, such as the acceleration sensor depicted in the Figures, it may be possible to integrate sensor/actuator structures and integrated evaluation circuits on one single chip, or component. For this purpose, the level of the sensor element that has an upper sacrificial layer and a cap layer may be produced in the manner described. To avoid impairing electronic circuits in a chip or component of this type, it may be advantageous to carry out the perforation of the cap layer, the etching of the upper sacrificial layer, the removal of the protective layers, and the enclosing of the hollow space by a covering layer, as well as the electrical connection of the contact terminals, after the manufacture of the circuits of a chip, or component, of this type. In these process steps, lower temperatures are created, so that the circuits, which can, for example, have transistors, are not damaged.

The preceding explanations of an exemplary embodiment of the present invention make clear that an embodiment of the present invention is not limited to an acceleration sensor according to the present invention, or to a method of the present invention for manufacturing it, but rather makes possible the manufacture of a multiplicity of micromechanical components, which have a hollow space, in particular, a hermetically sealed hollow space. This is especially the case if, in the hollow space, movable elements are provided from the entire range of micromechanics, such as sensor elements or also components of a micropump, etc.

What is claimed is:

1. A method for manufacturing a micromechanical component including at least one hollow space and at least one of a functional element and a functional layer, the at least one of the functional element and the functional layer provided at least partially in the at least one hollow space, the method comprising:

providing the at least one of the functional element and the functional layer with a first protective layer at least in an area that borders one of directly and indirectly on a first sacrificial layer, a material of the first protective layer being selected so that at least one of an etching process and an etching medium one of: i) does not substantially attack the first protective layer, and ii) substantially attacks the first protective layer only at a first reduced etching rate in comparison to a first etching rate of the first sacrificial layer, on a side of a second protective layer facing away from the first sacrificial layer, the at least one of the at least one etching process and the etching medium one of etching and dissolving the first sacrificial layer;

forming the at least one hollow space in at least one etching step subsequently to providing the first protective layer, the first sacrificial layer temporarily occupying at least partially a space of the at least one hollow space;

providing a cap layer that at least partially surrounds the at least one hollow space; and selecting a second material, the at least one of the functional element and the functional layer and at least one of the first sacrificial layer and a second sacrificial layer being substantially composed of the second material.

2. The method according to claim 1, wherein the second material is silicon.

3. The method according to claim 1, wherein the second material is polycrystalline.

4. The method according to claim 1, further comprising:

providing the second protective layer on at least a side of the first sacrificial layer facing away from the at least one of the functional element and the functional layer, a material of the second protective layer being selected so that the at least one of the at least one etching process and the etching medium one of does not substantially attack the second protective layer and substantially attacks the second protective layer only at another reduced etching rate in comparison to the first etching rate.

5. The method according to claim 4, further comprising:

selecting the second sacrificial layer so that at least one of at least one further etching process and a further etching medium one of does not substantially attack the at least one of the functional element and the functional layer and substantially attacks the at least one of the functional element and the functional layer only at another reduced etching rate in comparison to a second etching rate of the second sacrificial layer, the at least one of the at least one further etching process and the further etching medium one of etching and dissolving the second sacrificial layer; and selecting silicon oxide for the second sacrificial layer;

wherein the at least one of the functional element and the functional layer borders one of directly and indirectly on the second sacrificial layer.

6. The method according to claim 5, further comprising:

providing a third protective layer between the at least one of the functional element and the functional layer and the second sacrificial layer;

selecting the third protective layer so that at least one of at least one further etching process and a further etching medium one of does not substantially attack the third protective layer and substantially attacks the third protective layer only at another reduced etching rate in comparison to a second etching rate of the second sacrificial layer, the at least one of the at least one further etching process and the further etching medium one of etching and dissolving the second sacrificial layer;

selecting silicon oxide for the first sacrificial layer; and selecting a same third material for the third protective layer and at least one of the first protective layer and the second protective layer.

7. The method according to claim 6, wherein one of:

the first protective layer and the second protective layer all but completely enclose the first sacrificial layer; and the third protective layer and a fourth protective layer all but completely enclose the second sacrificial layer.

8. The method according to claim 7, further comprising:

selecting a same material for at least one of the first protective layer, the second protective layer, the third protective layer, and the fourth protective layer.

9. The method according to claim 8, wherein silicon oxide is selected for at least one of the first protective layer, the second protective layer, the third protective layer, and the fourth protective layer.

10. The method according to claim 1, further comprising:

removing at least one of the first sacrificial layer and the second sacrificial layer in at least one isotropic etching step.

11. The method according to claim 10, wherein the at least one isotropic etching step includes at least one silicon etching step.

* * * * *